United States Patent
Yang et al.

(10) Patent No.: US 11,356,119 B2
(45) Date of Patent: Jun. 7, 2022

(54) NONCOHERENT WIRELESS COMMUNICATION USING MODIFIED REED MULLER CODES

(71) Applicant: QUALCOMM Incorporated, San Diego, CA (US)

(72) Inventors: Wei Yang, San Diego, CA (US); Peter Gaal, San Diego, CA (US); Yi Huang, San Diego, CA (US); Krishna Kiran Mukkavilli, San Diego, CA (US); Tingfang Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 63 days.

(21) Appl. No.: 17/247,211

(22) Filed: Dec. 3, 2020

(65) Prior Publication Data

US 2021/0184697 A1    Jun. 17, 2021

Related U.S. Application Data

(60) Provisional application No. 62/949,329, filed on Dec. 17, 2019.

(51) Int. Cl.
*H03M 13/13* (2006.01)
*H03M 13/27* (2006.01)
(Continued)

(52) U.S. Cl.
CPC ......... *H03M 13/136* (2013.01); *H03M 13/27* (2013.01); *H04L 1/0003* (2013.01); *H04L 27/2082* (2013.01); *H04L 27/2613* (2013.01)

(58) Field of Classification Search
CPC .. H03M 13/616; H03M 13/136; H03M 13/27; H03M 13/2903; H04L 1/003;
(Continued)

(56) References Cited

U.S. PATENT DOCUMENTS

| | | | | |
|---|---|---|---|---|
| 2008/0316910 A1* | 12/2008 | Ashikhmin | .......... | H04B 7/0639 370/208 |
| 2009/0066545 A1* | 3/2009 | Kim | .................... | H03M 13/136 341/51 |
| 2011/0122846 A1 | 5/2011 | Yu et al. | | |

FOREIGN PATENT DOCUMENTS

WO    2012027819 A1    3/2012

OTHER PUBLICATIONS

Zhang et al., Reed Muller sequence for 5G Grant free massive access, IEEE, Dec. 12, 2017, pp. 1 to 7. (Year: 2007).*

(Continued)

*Primary Examiner* — Shelly A Chase
(74) *Attorney, Agent, or Firm* — Harrity & Harrity, LLP

(57) ABSTRACT

Various aspects of the present disclosure generally relate to wireless communication. In some aspects, a wireless communication device may generate a Reed Muller generating matrix for an information bit vector that includes a plurality of information bits. The wireless communication device may remove, from the Reed Muller generating matrix, a row vector consisting of all 1-values to form a modified Reed Muller generating matrix. The wireless communication device may encode the information bit vector using the modified Reed Muller generating matrix to form a codeword. The wireless communication device may transmit the codeword without transmitting a pilot signal or demodulation reference signal for the codeword. Numerous other aspects are provided.

30 Claims, 13 Drawing Sheets

(51) Int. Cl.
*H04L 27/20* (2006.01)
*H04L 27/26* (2006.01)
*H04L 1/00* (2006.01)

(58) Field of Classification Search
CPC ... H04L 1/0041; H04L 1/0047; H04L 1/0061; H04L 1/0063; H04L 27/2613
See application file for complete search history.

(56) References Cited

OTHER PUBLICATIONS

Ashikhmin et al., Space time Reed Muller codes for Noncoherent MIMO Transmission, IEEE, Sep. 2005, pp. 1 to 5. (Year: 2005).*
Intel Corporation: "On Potential Techniques for PUCCH Coverage Enhancement," 3GPP Draft, 3GPP TSG RAN WG1 #103-e, R1-2009602, 3RD Generation Partnership Project (3GPP), Mobile Competence Centre, 650, Route Des Lucioles, F-06921, Sophia-Antipolis Cedex, France, vol. RAN WG1. No. e-Meeting, Oct. 26, 2020-Nov. 13, 2020, Nov. 11, 2020 (Nov. 11, 2020), XP051953502, pp. 1-13.
International Search Report and Written Opinion—PCT/US2020/070861—ISA/EPO—dated Mar. 12, 2021.
NEC: "Discussion on PUCCH Coverage Enhancement," 3GPP Draft, 3GPP TSG RAN WG1 #103-e, R1-2008079, 3RD Generation Partnership Project (3GPP), Mobile Competence Centre, 650, Route Des Lucioles, F-06921, Sophia-Antipolis Cedex, France, vol. RAN WG1. No. e-Meeting, Oct. 26, 2020-Nov. 13, 2020, Oct. 16, 2020 (Oct. 16, 2020), XP051939456, 3 pages.

* cited by examiner

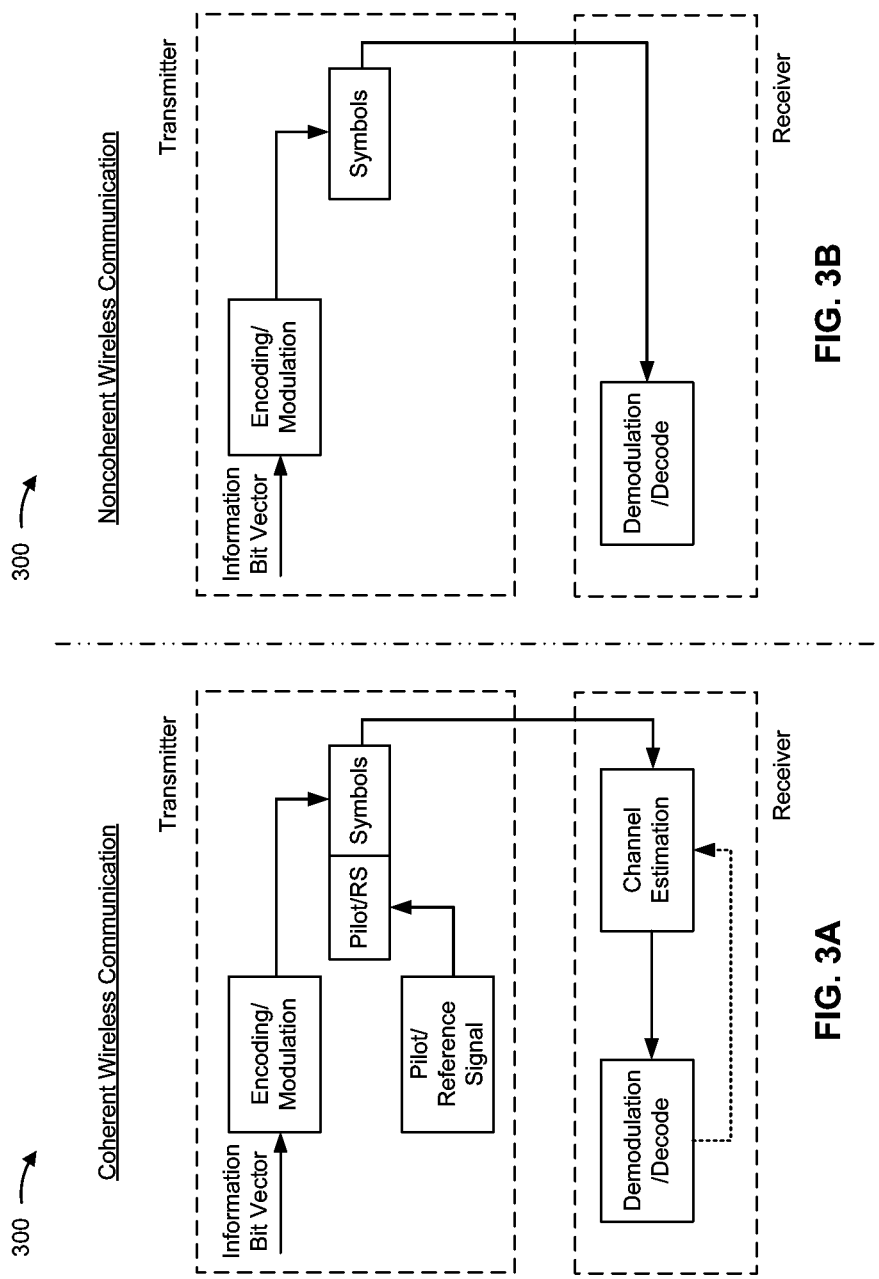

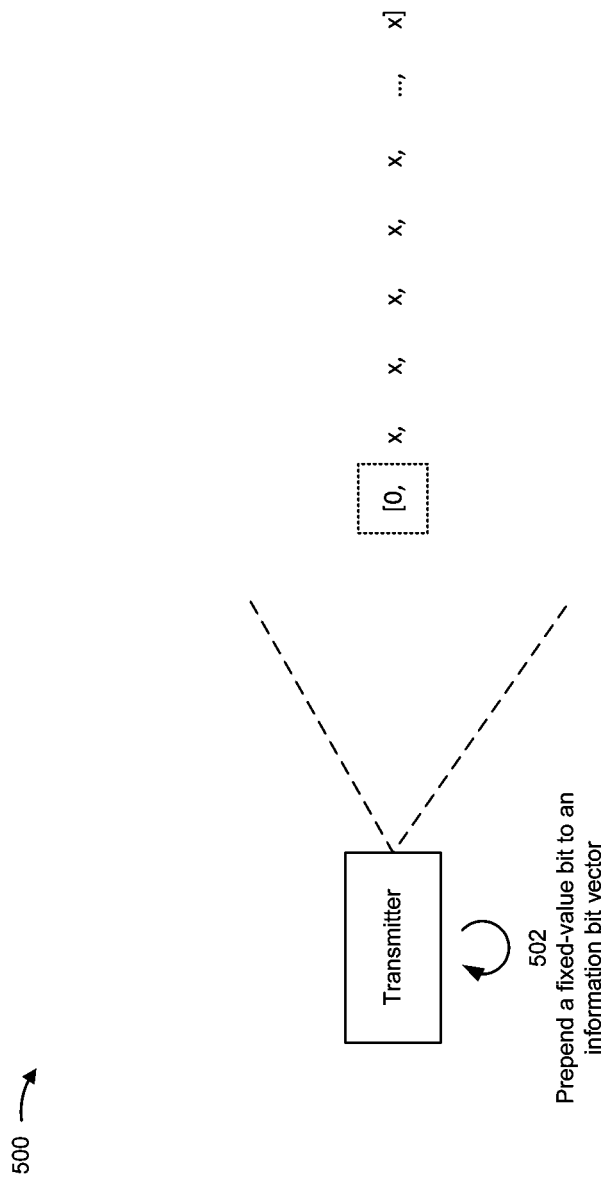

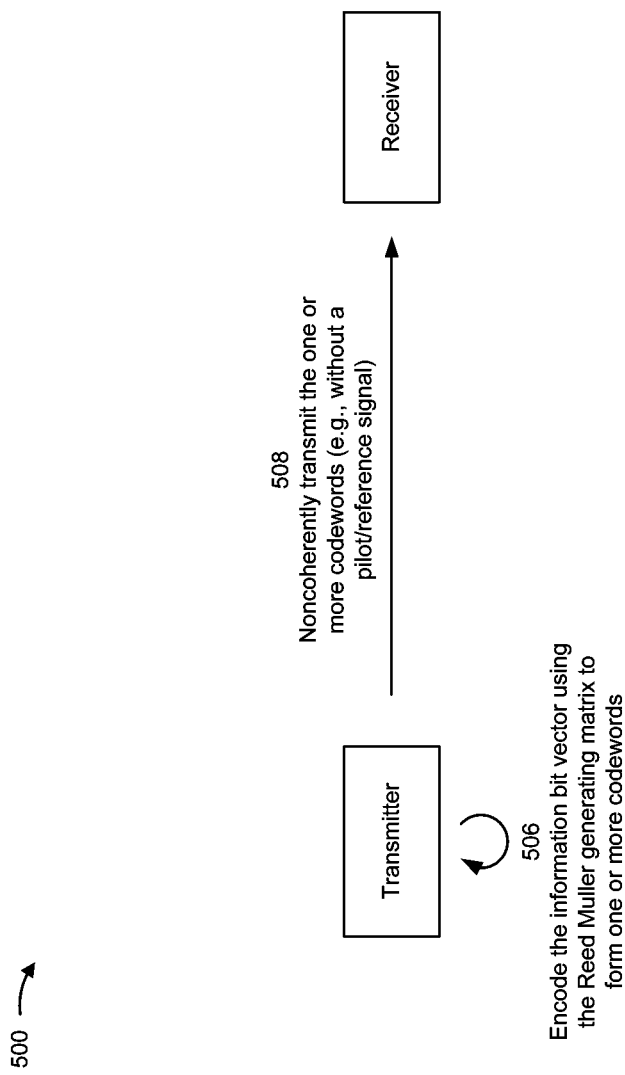

NONCOHERENT WIRELESS COMMUNICATION USING MODIFIED REED MULLER CODES

CROSS-REFERENCE TO RELATED APPLICATION

This patent application claims priority to U.S. Provisional Patent Application No. 62/949,329, filed on Dec. 17, 2019, entitled "NONCOHERENT WIRELESS COMMUNICATION USING MODIFIED REED MULLER CODES," and assigned to the assignee hereof. The disclosure of the prior application is considered part of and is incorporated by reference into this patent application.

FIELD OF THE DISCLOSURE

Aspects of the present disclosure generally relate to wireless communication and to techniques and apparatuses for noncoherent wireless communication using modified Reed Muller codes.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, and/or the like.

The above multiple access technologies have been adopted in various telecommunication standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a wireless communication device, may include generating a Reed Muller generating matrix for an information bit vector that includes a plurality of information bits; removing, from the Reed Muller generating matrix, a row vector consisting of all 1-values to form a modified Reed Muller generating matrix; encoding the information bit vector using the modified Reed Muller generating matrix to form a codeword; and transmitting the codeword without transmitting a pilot signal or demodulation reference signal for the codeword.

In some aspects, a method of wireless communication, performed by a wireless communication device, may include prepending a fixed-value bit to an information bit vector that includes a plurality of information bits; generating a Reed Muller generating matrix for the information bit vector; encoding, using the Reed Muller generating matrix, the information bit vector with the fixed-value bit prepended to the information bit vector to form a codeword; and transmitting the codeword without transmitting a pilot signal or demodulation reference signal for the codeword.

In some aspects, a wireless communication device for wireless communication may include memory and one or more processors operatively coupled to the memory. The memory and the one or more processors may be configured to generate a Reed Muller generating matrix for an information bit vector that includes a plurality of information bits; remove, from the Reed Muller generating matrix, a row vector consisting of all 1-values to form a modified Reed Muller generating matrix; encode the information bit vector using the modified Reed Muller generating matrix to form a codeword; and transmit the codeword without transmitting a pilot signal or demodulation reference signal for the codeword.

In some aspects, a wireless communication device for wireless communication may include memory and one or more processors operatively coupled to the memory. The memory and the one or more processors may be configured to prepend a fixed-value bit to an information bit vector that includes a plurality of information bits; generate a Reed Muller generating matrix for the information bit vector; encode, using the Reed Muller generating matrix, the information bit vector with the fixed-value bit prepended to the information bit vector to form a codeword; and transmit the codeword without transmitting a pilot signal or demodulation reference signal for the codeword.

In some aspects, a non-transitory computer-readable medium may store one or more instructions for wireless communication. The one or more instructions, when executed by one or more processors of a wireless communication device, may cause the one or more processors to: generate a Reed Muller generating matrix for an information bit vector that includes a plurality of information bits; remove, from the Reed Muller generating matrix, a row vector consisting of all 1-values to form a modified Reed Muller generating matrix; encode the information bit vector using the modified Reed Muller generating matrix to form a codeword; and transmit the codeword without transmitting a pilot signal or demodulation reference signal for the codeword.

In some aspects, a non-transitory computer-readable medium may store one or more instructions for wireless communication. The one or more instructions, when executed by one or more processors of a wireless communication device, may cause the one or more processors to: prepend a fixed-value bit to an information bit vector that includes a plurality of information bits; generate a Reed Muller generating matrix for the information bit vector; encode, using the Reed Muller generating matrix, the information bit vector with the fixed-value bit prepended to the information bit vector to form a codeword; and transmit the codeword without transmitting a pilot signal or demodulation reference signal for the codeword.

In some aspects, an apparatus for wireless communication may include means for generating a Reed Muller generating matrix for an information bit vector that includes a plurality of information bits; means for removing, from the Reed Muller generating matrix, a row vector consisting of all 1-values to form a modified Reed Muller generating matrix; means for encoding the information bit vector using the modified Reed Muller generating matrix to form a codeword; and means for transmitting the codeword without transmitting a pilot signal or demodulation reference signal for the codeword.

In some aspects, an apparatus for wireless communication may include means for prepending a fixed-value bit to an information bit vector that includes a plurality of information bits; means for generating a Reed Muller generating matrix for the information bit vector; means for encoding, using the Reed Muller generating matrix, the information bit vector with the fixed-value bit prepended to the information bit vector to form a codeword; and means for transmitting the codeword without transmitting a pilot signal or demodulation reference signal for the codeword.

Aspects generally include a method, apparatus, system, computer program product, non-transitory computer-readable medium, user equipment, base station, wireless communication device, and/or processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIGS. 3A and 3B are block diagrams conceptually illustrating one or more examples of various types of wireless communication, in accordance with various aspects of the present disclosure.

FIGS. 4A-4C and 5A-5C are diagrams illustrating one or more examples of noncoherent wireless communication using modified Reed Muller codes, in accordance with various aspects of the present disclosure.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements").

These elements may be implemented using hardware, software, or combinations thereof. Whether such elements are implemented as hardware or software depends upon the particular application and design constraints imposed on the overall system.

It should be noted that while aspects may be described herein using terminology commonly associated with 3G and/or 4G wireless technologies, aspects of the present disclosure can be applied in other generation-based communication systems, such as 5G and later, including NR technologies.

Figure 1:
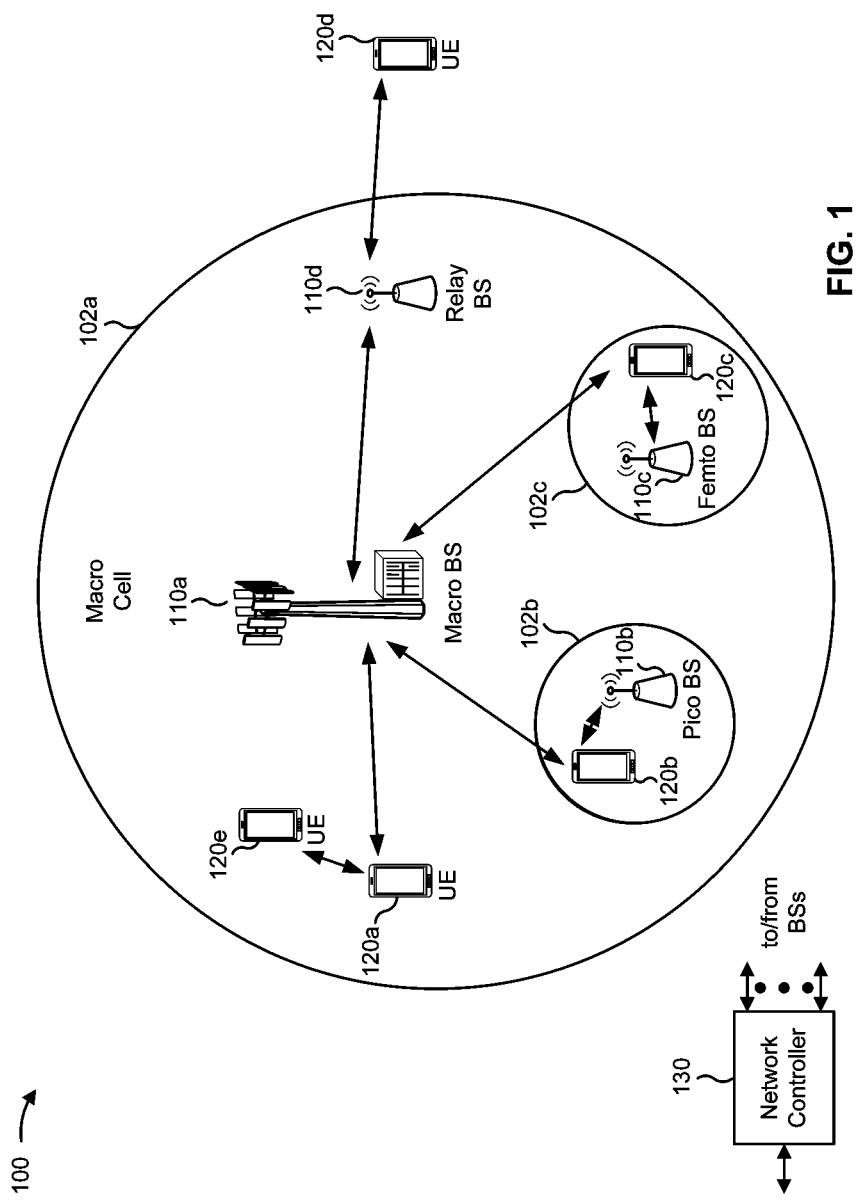
FIG. 1 is a block diagram conceptually illustrating an example of a wireless communication network, in accordance with various aspects of the present disclosure.

FIG. 1 is a diagram illustrating a wireless network 100 in which aspects of the present disclosure may be practiced. The wireless network 100 may be an LTE network or some other wireless network, such as a 5G or NR network. The wireless network 100 may include a number of BSs 110 (shown as BS 110a, BS 110b, BS 110c, and BS 110d) and other network entities. ABS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, directly or indirectly, via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular radio access technology (RAT) and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided as an example. Other examples may differ from what is described with regard to FIG. 1.

Figure 2:
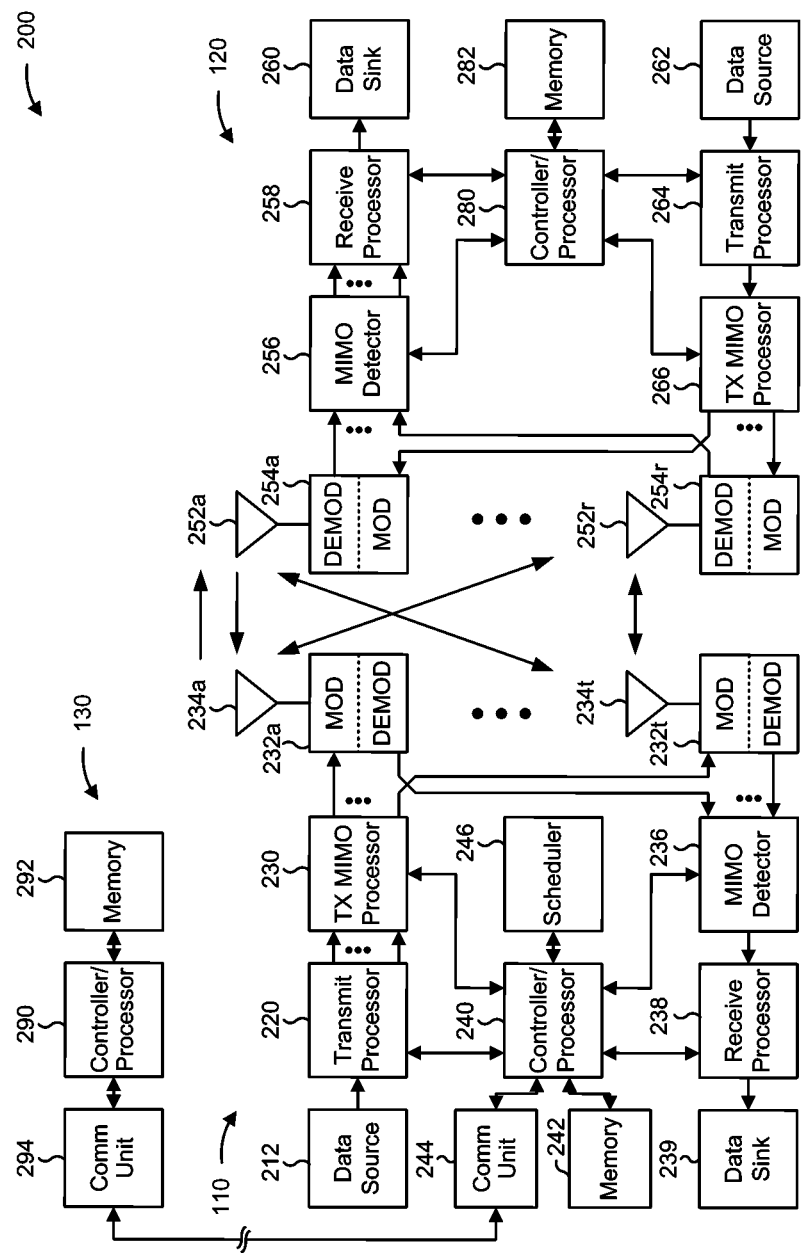
FIG. 2 is a block diagram conceptually illustrating an example of a base station in communication with a UE in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with noncoherent wireless communication using modified Reed Muller codes, as described in more detail elsewhere herein. For example, controller/processor 240 of base station 110, controller/processor 280 of UE 120, and/or any other component(s) of FIG. 2 may perform or direct operations of, for example, process 600 of FIG. 6, process 700 of FIG. 7, and/or other processes as described herein. Memories 242 and 282 may store data and program codes for base station 110 and UE 120, respectively. In some aspects, memory 242 and/or memory 282 may comprise a non-transitory computer-readable medium storing one or more instructions for wireless communication. For example, the one or more instructions, when executed by one or more processors of the base station 110 and/or the UE 120, may perform or direct operations of, for example, process 600 of FIG. 6, process 700 of FIG. 7, and/or other processes as described herein. A scheduler 246 may schedule UEs for data transmission on the downlink and/or uplink.

In some aspects, UE 120 may include means for generating a Reed Muller generating matrix for an information bit vector that includes a plurality of information bits, means for removing, from the Reed Muller generating matrix, a row vector consisting of all 1-values to form a modified Reed Muller generating matrix, means for encoding the information bit vector using the modified Reed Muller generating matrix to form a codeword, means for transmitting the codeword without transmitting a pilot signal or demodulation reference signal for the codeword, and/or the like. In some aspects, UE 120 may include means for prepending a fixed-value bit to an information bit vector that includes a plurality of information bits, means for generating a Reed Muller generating matrix for the information bit vector with the fixed-value bit prepended to the information bit vector, means for encoding, using the Reed Muller generating matrix, the information bit vector with the fixed-value bit prepended to the information bit vector to form a codeword, means for transmitting the codeword without transmitting a pilot signal or demodulation reference signal for the codeword, and/or the like. In some aspects, such means may include one or more components of UE 120 described in connection with FIG. 2, such as controller/processor 280, transmit processor 264, TX MIMO processor 266, MOD 254, antenna 252, DEMOD 254, MIMO detector 256, receive processor 258, and/or the like.

In some aspects, base station 110 may include means for generating a Reed Muller generating matrix for an information bit vector that includes a plurality of information bits, means for removing, from the Reed Muller generating matrix, a row vector consisting of all 1-values to form a modified Reed Muller generating matrix, means for encoding the information bit vector using the modified Reed Muller generating matrix to form a codeword, means for transmitting the codeword without transmitting a pilot signal or demodulation reference signal for the codeword, and/or the like. In some aspects, base station 110 may include means for prepending a fixed-value bit to an information bit vector that includes a plurality of information bits, means for generating a Reed Muller generating matrix for the information bit vector with the fixed-value bit prepended to the information bit vector, means for encoding, using the Reed Muller generating matrix, the information bit vector with the fixed-value bit prepended to the information bit vector to form a codeword, means for transmitting the codeword without transmitting a pilot signal or demodulation reference signal for the codeword, and/or the like. In some aspects, such means may include one or more components of base station 110 described in connection with FIG. 2, such as antenna 234, DEMOD 232, MIMO detector 236, receive processor 238, controller/processor 240, transmit processor 220, TX MIMO processor 230, MOD 232, antenna 234, and/or the like.

As indicated above, FIG. 2 is provided as an example. Other examples may differ from what is described with regard to FIG. 2.

FIGS. 3A and 3B are block diagrams conceptually illustrating one or more examples 300 of various types of wireless communication, in accordance with various aspects of the present disclosure. FIG. 3A illustrates an example 300 of coherent wireless communication and FIG. 3B illustrates and example 300 of noncoherent wireless communication. The various types of wireless communication illustrated in FIGS. 3A and 3B may be performed by wireless communication devices, such as a UE 120, a BS 110, and/or the like.

As shown in FIG. 3A, coherent communication may include wireless communication involving the use of pilot signals and/or reference signals. A wireless communication device (referred to as a "transmitter") may transmit an information bit vector (e.g., a string of bits carrying one or more types of information) by encoding the information bit vector to form one more codewords that each include a plurality of coded bits, modulating the codewords to form one or more orthogonal frequency division multiplexing (OFDM) symbols, generating a pilot signal or reference signal associated with the OFDM symbols (e.g., a demodulation reference signal (DMRS) and/or another type of reference signal), and transmitting the pilot/reference signal and the OFDM symbols over a wireless physical channel (e.g., a physical downlink control channel (PDCCH), a physical downlink shared channel (PDSCH), a physical uplink control channel (PUCCH), a physical uplink shared channel (PUSCH), and/or the like) to another wireless communication device (referred to as a "receiver").

As further shown in FIG. 3A, the receiver may receive the pilot/reference signal and the OFDM symbols via the physical channel, and may use the pilot/reference signal to obtain channel state information associated with the physical channel. For example, the receiver may demodulate and decode the pilot/reference signal and the OFDM symbols, may perform a channel estimation of the physical channel based at least in part on the demodulation and/or decoding of the pilot/reference signal, and may adjust or modify demodulation and/or decoding parameters for the receiver to increase the efficiency and performance of demodulation and/or decoding for the receiver.

In some cases, coherent communication in a wireless system may be suboptimal at low signal to noise ratios (SNR). For example, the energy used to transmit, decode, and/or measure pilot/reference signals may be wasted because, at low SNR, pilot/reference signals may contain little to no useful information for the receiver. Moreover, attempting to perform a channel estimation at low SNR may result in an inaccurate and/or poor quality channel estimation, which in turn may result in degraded performance in demodulation and/or decoding.

As shown in FIG. 3B, a transmitter and a receiver may perform noncoherent communication to increase demodulation and/or decoding performance in low SNR scenarios. "Noncoherent communication" may refer to a wireless communication scheme in which the transmitter does not transmit any pilot signals or reference signals for OFDM symbols carrying data/information. In this case, the receiver directly demodulates and decodes the received OFDM symbols without performing a channel estimation based at least in part on a pilot signal or reference signal.

Noncoherent communication schemes rely on a channel coherence principal that channel properties for adjacent coded OFDM symbols (e.g., adjacent in time resources and/or frequency resources) are the same or roughly the same. This permits a transmitter to use differential modulation (e.g., where information is modulated based at least in part on the phase difference between adjacent coded OFDM symbols) and/or sequence-based modulation (e.g., where information is modulated jointly on a sequence of OFDM symbols). However, the longer that channel coherence is used (e.g., the greater the quantity of adjacent coded OFDM symbols that are considered to be coherent), the greater the complexity of encoding at the transmitter and decoding at the receiver. In some channel encoding/decoding techniques, channel coherence may cause an exponential increase in encoding and decoding.

As indicated above, FIGS. 3A and 3B are provided as one or more examples. Other examples may differ from what is described with respect to FIGS. 3A and 3B.

A wireless communication device (e.g., a transmitter) may encode an information bit vector using various encoding techniques. One encoding technique includes the use of Reed Muller codes. A Reed Muller code is a class of linear block codes that is used in various wireless networks and in deep space communications. A Reed Muller code may be defined by an order r and a dimension m, where $0 \leq r \leq m$. For a Reed Muller code with an order r and a dimension m, a blocklength may be defined as $N=2^m$, and the maximum payload size of the Reed Muller code (e.g., the quantity of information bits that the Reed Muller code is capable of carrying) is given by $$K = \sum_{j=0}^{r} \binom{m}{j}$$

To encode an information bit vector using a Reed Muller code, a transmitter may generate a Reed Muller generating matrix and may right-multiply the information bit vector with the Reed Muller generating matrix, where the multiplication is in the binary field. The information bit vector may include a row vector, in which case the a $2^m$ by K matrix may be right-multiplied with the 1 by K column vector to generate a codeword the of size 1 by $2^m$. The transmitter may generate the Reed Muller generating matrix by generating a tensor product of a binary Hadamard matrix (e.g., a 2×2 binary Hadamard matrix). The resulting matrix may be a $2^3 \times 2^3$ binary matrix. To obtain the Reed Muller generating matrix from the tensor product of the binary Hadamard matrix, the transmitter may identify a particular quantity of row vectors having the greatest Hamming weight (e.g., having the greatest quantity of 1-value bits). For example, to obtain a Reed Muller generating matrix for an order of 1 and a dimension of 3, the transmitter may identify 4 row vectors having the greatest Hamming weight. As another example, to obtain a Reed Muller generating matrix for an order of 2 and a dimension of 3, the transmitter may identify 7 row vectors having the greatest Hamming weight.

Reed Muller codes having a relatively low order (e.g., an order of 3 or less) may have a very large minimum distance, which permits a receiver to obtain near-optimal decoding performance with relatively moderate complexity in noncoherent communication schemes. However, Reed Muller codes are nested in that a Reed Muller code of order r and a dimension m contains a Reed Muller code of order r−1 and a dimension m, a Reed Muller code of order r−1 and a dimension m contains a Reed Muller code of order r−2 and a dimension m, and so on. Thus, all Reed Muller codes with an order greater than 0 contain a Reed Muller code of order 0, which produces a Reed Muller generating matrix of all 1-values (e.g., [1, 1, . . . , 1, 1]). As a result, if the bit values in half of the codewords generated by a Reed Muller code with an order greater than 0 are flipped, this results in the other half of the codewords generated by the same Reed Muller code. If a first codeword for an information bit vector [0, x, x, x] and a second codeword for an information bit vector [1, x, x, x] are transmitted noncoherently over a physical channel that does not have a known phase to the receiver, the receiver may not be able to distinguish between the first codeword and the second codeword because the received OFDM symbols for the first codeword and the received OFDM symbols for the second codeword may only differ by a constant phase (which is unknown to the receiver due to the communication between the transmitter and the receiver being noncoherent). More specifically, a first codeword for an information bit vector [0, x . . . x] is a bit-flipped version of a second codeword for an information bit vector [1, x, . . . , x]. After modulation, these two codewords will only differ by a constant phase. For example, if the modulated first codeword is x1, . . . , xN, then the second codeword after modulation becomes −x1, . . . , −xN. The modulation will convert a binary codeword into a sequence of modulated complex symbols. As a consequence, the modulated first and second codeword will not be distinguishable by the receiver over a noncoherent channel. Accordingly, the use of a Reed Muller code in noncoherent communication may result in a minimum block error rate (BLER) of at least 0.5, which may result in poor decoding performance and high information loss at the receiver.

Some aspects described herein provide techniques and apparatuses for noncoherent wireless communication using modified Reed Muller codes. In some aspects, a wireless communication device (e.g., a UE 120, a base station 110, and/or the like) may generate a Reed Muller generating matrix for an information bit vector and may modify the Reed Muller generating matrix by removing a row vector consisting of all 1-values. In this case, the wireless communication device removes the nested Reed Muller generating matrix corresponding to a Reed Muller code of order 0 from the overall Reed Muller generating matrix, which results in a modified Reed Muller generating matrix that may be used to encode K−1 information bits into N coded bits. More specifically, a modified Reed Muller code of order r and dimension m may be used to encode K−1 information bits into N coded bits, where $$K = \sum_{j=0}^{r} \binom{m}{j} = 1 + \sum_{j=1}^{r} \binom{m}{j}.$$

The wireless communication may use the modified Reed Muller generating matrix to encode the information bit vector to form one or more codewords, and may transmit the one or more codewords to a receiver without a pilot signal or reference signal (e.g., DMRS and/or another type of reference signal). This reduces the decoding BLER at the receiver when using Reed Muller codes for noncoherent communication, which may improving the decoding performance at the receiver while permitting the use of Reed Muller codes for noncoherent communication.

In some aspects, a wireless communication device may generate a Reed Muller generating matrix for an information bit vector and may prepend a fixed-value bit to the information bit vector before using the Reed Muller generating matrix to form codewords from the information bit vector. In this case, the wireless communication device may take an information bit vector including K−1 information bits, and may prepend a 0-value or a 1-value to obtain a K-bit information bit vector. In some examples, the first row of the Reed Muller generator matrix corresponds to the all 1 vector. However, in other examples, the all-1 vector may be placed as the last row of the Reed Muller generator matrix. In such cases, the fix-value may be appended to the information vector (instead of pre-pend).

The wireless communication device may encode the K-bit information vector using a Reed Muller generating matrix of order r and dimension m to form one or more codewords, and may transmit the one or more codewords to a receiver. In this way, the fixed-value bit prepended to the information bit vector removes the ambiguity, between codewords formed from information bit vectors differing by a first bit value in each of the information bit vectors, resulting from an unknown phase of a physical channel over which the codewords are transmitted. This reduces the decoding BLER at the receiver when using Reed Muller codes for noncoherent communication, which may increase decoding performance at the receiver while permitting the use of Reed Muller codes for noncoherent communication, which decreases the demodulation and decoding complexity for the receiver.

Figure 4A:
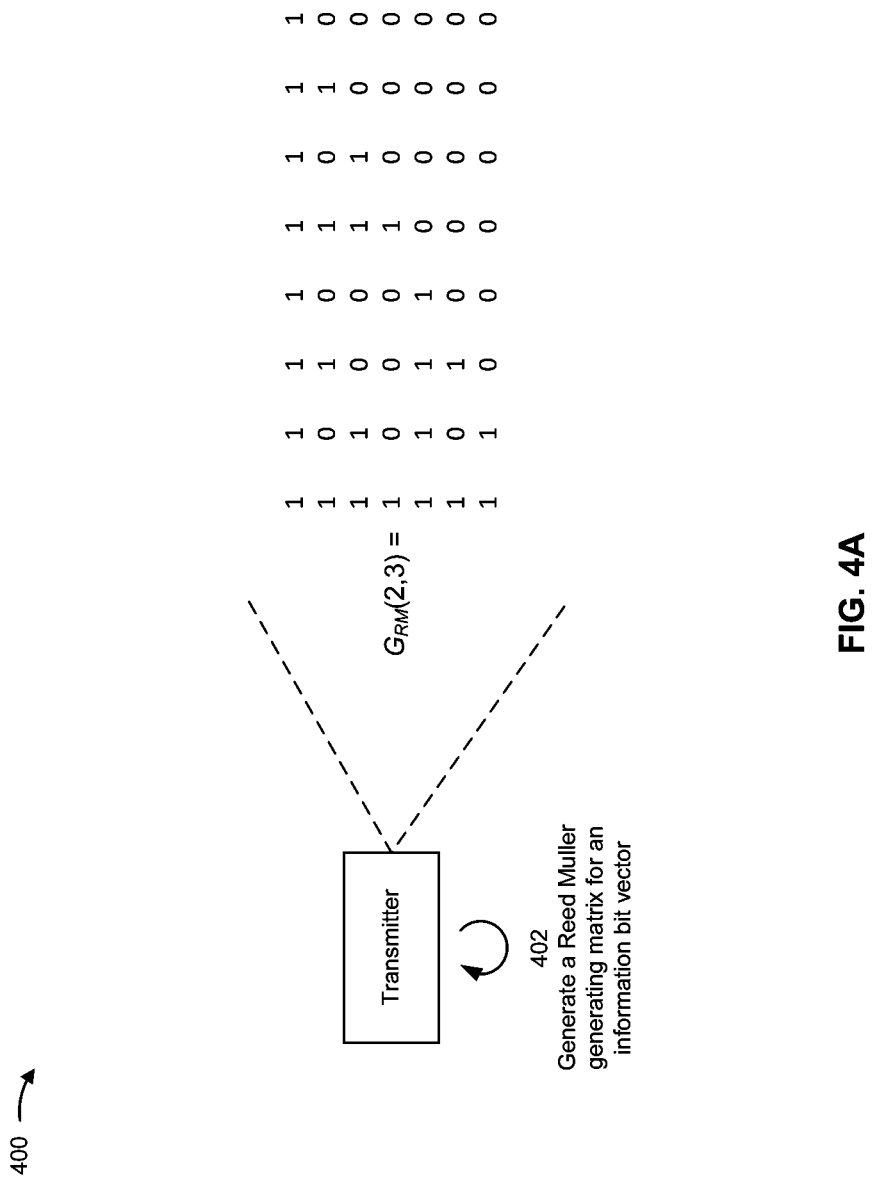
Figure 4B:
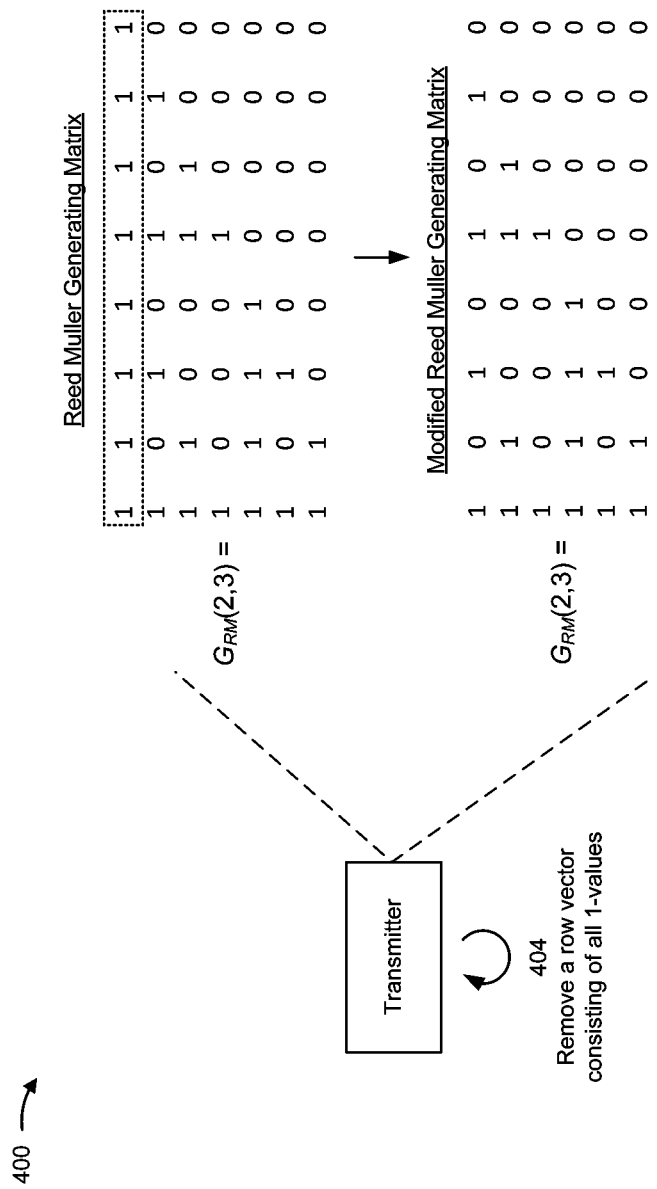
Figure 4C:
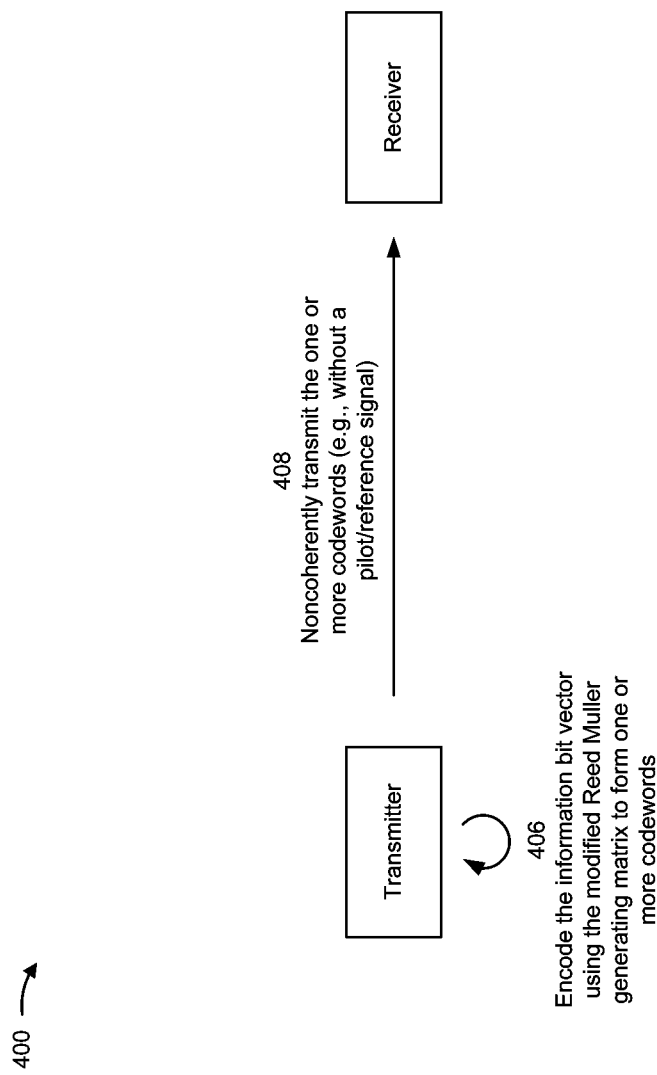

FIGS. 4A-4C are diagrams illustrating one or more examples 400 of noncoherent wireless communication using modified Reed Muller codes, in accordance with various aspects of the present disclosure. As shown in FIGS. 4A-4C, example(s) 400 may include communication between a transmitter and a receiver. The transmitter and the receiver may each include a wireless communication device. The wireless communication device for each of the transmitter and the receiver may be a UE 120, a base station 110, and/or another type of wireless communication device. The transmitter and the receiver may be included in a wireless network, such as wireless network 100 and/or another type of wireless network.

In some aspects, the transmitter and the receiver may communicate via noncoherent communication. In this case, the transmitter may receive an information bit stream, may encode the information bit stream to form one or more codewords, may modulate the codewords to form one or more OFDM symbols, and may transmit the OFDM symbols to the receiver without transmitting associated pilot signal or reference signal (e.g., DMRS and/or other types of reference signals).

As shown in FIG. 4A, and by reference number 402, to encode an information bit vector that includes a plurality of information bits, the transmitter may generate a Reed Muller generating matrix for the information bit vector. As shown in FIG. 4A, an example Reed Muller generating matrix $G_{RM}(2,3)$ may be generated by the transmitter for a Reed Muller code having an order of 2 and a dimension of 3. In this case, the resulting Reed Muller generating matrix $G_{RM}$ (2,3) may have 7 row vectors each including 8 bit values. Each of the 8 bit values may represent a 1-value or a 0-value.

In some aspects, the transmitter may generate a Reed Muller generating matrix may corresponding to a Reed Muller code having an order that satisfies an order threshold. For example, to ensure that the information bit vector is encoded with a low channel coding rate, the order threshold may be an order of 2 or 3 such that the transmitter generates a Reed Muller generating matrix corresponding to a Reed Muller code having an order that is less than or equal to an order of 2 or 3. This prevents the decoding complexity at the receiver from being too high to permit Reed Muller codes from being used for noncoherent communication. Thus, in some aspects, to ensure that the order of the Reed Muller code associated with the Reed Muller generating matrix is low, the transmitter may use the Reed Muller generating matrix to encode the information bit vector based at least in part on determining that the coding rate to be used for the information bit vector satisfies a coding rate threshold, may determine that the quantity of bits included in the information bit vector satisfies a quantity threshold, and/or the like.

As shown in FIG. 4B, and by reference number 404, the transmitter may remove a row vector from the Reed Muller generating matrix to form a modified Reed Muller generating matrix in which a row vector consisting of all 1-values is removed. This removes the nested Reed Muller generating matrix having an order of 0 from the Reed Muller generating matrix. The modified Reed Muller generating matrix may correspond to a (K−1, N) Reed Muller code, which may be used to encode up to K−1 information bits into N coded bits. As an example, if K−1=6, N=8, and if the sequence of information bits is [0, 1, 1, 0, 0, 0], then the encoded bits can be obtained by right-multiplying the information bit vector [0, 1, 1, 0, 0, 0] by the Reed Muller generating matrix illustrated in FIG. 4B, which may yield an encoded bit vector of [0, 1, 0, 0, 0, 1, 0, 0].

As shown in FIG. 4C, and by reference number 406, the transmitter may encode the information bit vector using the modified Reed Muller generating matrix to form one or more codewords. Each of the codewords may include a plurality of coded bits. In some aspects, the transmitter may encode the information bit vector by right-multiplying the information bit vector with the modified Reed Muller generating matrix, where the multiplication is in the binary field.

In some cases, the blocklength n and the payload size k of the information bit vector may be non-standard or arbitrary. In this case, to encode the information bit vector, the transmitter may generate a parent modified Reed Muller generating matrix corresponding to a parent (K−1, N) Reed Muller code with order r and dimension m, and may extend the parent (K−1, N) Reed Muller code to a specified (k, n) Reed Muller code. To extend the parent (K−1, N) Reed Muller code to a specified (k, n) Reed Muller code, the transmitter may determine a largest value for a dimension m codeword such that $2^m \leq n$, may generate a $2^m$-length codeword, and may cyclically repeat the $2^m$-length codeword to form an n-length codeword. In some aspects, the transmitter may determine the largest value for the dimension m codeword based at least in part on an upper limit on order r.

As an example of the above, if the transmitter is to encode k information bits into n coded bits, the transmitter may determine r, m (and thus, K, N) by determining the following inequalities/equalities:

$$k \leq K - 1 = \sum_{j=1}^{r} \binom{m}{j} \quad (1)$$

$$r \leq 3 \quad (2)$$

$$n \leq N = 2^m \quad (3)$$

There may be multiple pairs of (r, m) values that satisfy the above inequalities/equalities. The transmitter may identify the pair that has smallest m. For the same m, the transmitter may identify the smallest value of r that satisfies r≤3. In some aspects, the transmitter may identify the smallest value for $m=m_0$ such that:

$$n \leq N = 2^{m_0}$$

The transmitter may determine if for such an m, whether inequality (1) above is satisfied for r=3 and $m=m_0$. If not, the transmitter may increase $m_0$ by 1 (e.g., may set $m_0=m_0+1$). If so, the transmitter may determine whether inequality (1) above is satisfied for r=2, $m=m_0$. If so, the transmitter may set r=2, $m=m_0$. If not, the transmitter may set r=3, and $m=m_0$.

As further shown in FIG. 4C, and by reference number 408, the transmitter may noncoherently transmit the one or more codewords over a physical channel to the receiver. In this case, the transmitter may transmit the one or more codewords without transmitting an associated pilot signal or reference signal. In some aspects, to transmit the one or more codewords, the transmitter may modulate the one or more codewords into one or more OFDM symbols and may transmit the one or more OFDM symbols over the physical channel to the receiver. In some aspects, to achieve a low peak to average power ratio (PAPR) for the transmission of the OFDM symbols, the transmitter may modulate the one or more codewords using π/2 binary phase shift keying (BPSK) modulation or quadrature phase-shift keying (QPSK) modulation. In some aspects, the transmitter may modulate the one or more codewords using one or more time-domain filters, one or more frequency-domain filters, and/or the like.

In this way, the transmitter may generate a Reed Muller generating matrix for an information bit vector and may modify the Reed Muller generating matrix by removing a row vector consisting of all 1-values, which removes the nested Reed Muller generating matrix corresponding to a Reed Muller code of order 0 from the overall Reed Muller generating matrix. The resulting modified Reed Muller generating matrix may be used to encode K−1 information bits into N coded bits. The transmitter may use the modified Reed Muller generating matrix to encode the information bit vector to form one or more codewords, and may transmit the one or more codewords to a receiver without a pilot signal or reference signal. This reduces the decoding BLER at the receiver when using Reed Muller codes for noncoherent communication, which may increase decoding performance at the receiver while permitting the use of Reed Muller codes for noncoherent communication, which decreases the demodulation and decoding complexity for the receiver.

As indicated above, FIGS. 4A-4C are provided as one or more examples. Other examples may differ from what is described with respect to FIGS. 4A-4C.

Figure 5B:
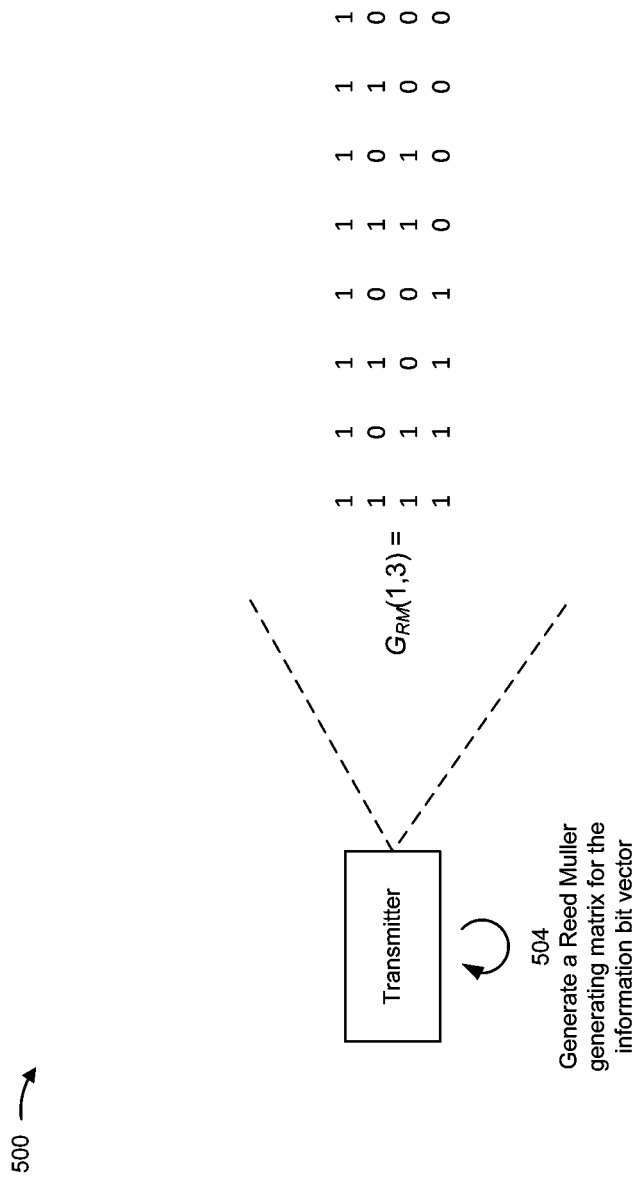

FIGS. 5A-5C are diagrams illustrating one or more examples 500 of noncoherent wireless communication using modified Reed Muller codes, in accordance with various aspects of the present disclosure. As shown in FIGS. 5A-5C, example(s) 500 may include communication between a transmitter and a receiver. The transmitter and the receiver may each include a wireless communication device. The wireless communication device for each of the transmitter and the receiver may be a UE 120, a base station 110, and/or another type of wireless communication device. The transmitter and the receiver may be included in a wireless network, such as wireless network 100 and/or another type of wireless network.

In some aspects, the transmitter and the receiver may communicate via noncoherent communication. In this case, the transmitter may receive an information bit stream, may encode the information bit stream to form one or more codewords, may modulate the codewords to form one or more OFDM symbols, and may transmit the OFDM symbols to the receiver without transmitting associated pilot signal or reference signal (e.g., DMRS and/or other types of reference signals).

As shown in FIG. 5A, and by reference number 502, to encode an information bit vector that includes a plurality of information bits (e.g., K−1 information bits), the transmitter may prepend a fixed-value bit to the information bit vector (e.g., may add a fixed value bit to the beginning of the information bit vector) to form a K-bit information bit vector. The fixed-value bit may be a 1-value bit or a 0-value bit, so long as the same fixed-value bit is prepended to the information bit vector and other information bit vectors to be encoded by the transmitter.

As shown in FIG. 5B, and by reference number 504, the transmitter may generate a Reed Muller generating matrix for the information bit vector with the prepended fixed-bit value. As shown in FIG. 5B, an example Reed Muller generating matrix $G_{RM}(1,3)$ may be generated by the transmitter for a Reed Muller code having an order of 1 and a dimension of 3. In this case, the resulting Reed Muller generating matrix $G_{RM}(1,3)$ may have 4 row vectors each including 8 bit values. Each of the 8 bit values may represent a 1-value or a 0-value.

In some aspects, the transmitter may generate a Reed Muller generating matrix may corresponding to a Reed Muller code having an order that satisfies an order threshold. For example, to ensure that the information bit vector is encoded with a low channel coding rate, the order threshold may be an order of 2 or 3 such that the transmitter generates a Reed Muller generating matrix corresponding to a Reed Muller code having an order that is less than or equal to an order of 2 or 3. This prevents the decoding complexity at the receiver from being too high to permit Reed Muller codes from being used for noncoherent communication. Thus, in some aspects, to ensure that the order of the Reed Muller code associated with the Reed Muller generating matrix is low, the transmitter may use the Reed Muller generating matrix to encode the information bit vector based at least in part on determining that the coding rate to be used for the information bit vector satisfies a coding rate threshold, may determine that the quantity of bits included in the information bit vector satisfies a quantity threshold, and/or the like.

As shown in FIG. 5C, and by reference number 506, the transmitter may encode the information bit vector using the Reed Muller generating matrix to form one or more codewords. Each of the codewords may include a plurality of coded bits. In some aspects, the transmitter may encode the information bit vector with the prepended fixed-value bit by right-multiplying the information bit vector with the Reed Muller generating matrix, where the multiplication is in the binary field.

In some cases, the blocklength n and the payload size k of the information bit vector may be non-standard or arbitrary. In this case, to encode the information bit vector, the transmitter may generate a parent Reed Muller generating matrix corresponding to a parent (K−1, N) Reed Muller code with order r and dimension m, and may extend the parent (K−1, N) Reed Muller code to a specified (k, n) Reed Muller code. To extend the parent (K−1, N) Reed Muller code to a specified (k, n) Reed Muller code, the transmitter may determine a largest value for a dimension m codeword such that $2^m \leq n$, may generate a $2^m$-length codeword, and may cyclically repeat the $2^m$-length codeword to form an n-length codeword. In some aspects, the transmitter may determine the largest value for the dimension m codeword based at least in part on an upper limit on order r.

As further shown in FIG. 5C, and by reference number 508, the transmitter may noncoherently transmit the one or more codewords over a physical channel to the receiver. In this case, the transmitter may transmit the one or more codewords without transmitting an associated pilot signal or reference signal. In some aspects, to transmit the one or more codewords, the transmitter may modulate the one or more codewords into one or more OFDM symbols and may transmit the one or more OFDM symbols over the physical channel to the receiver. In some aspects, to achieve a low PAPR for the transmission of the OFDM symbols, the transmitter may modulate the one or more codewords using $\pi/2$ BPSK modulation or quadrature phase-shift keying (QPSK) modulation, using one or more time-domain filters, one or more frequency-domain filters, and/or the like.

In this way, the transmitter may generate a Reed Muller generating matrix for an information bit vector with a prepended fixed-value bit and may encode the information bit vector with the prepended fixed-value bit using the Reed Muller generating matrix. The fixed-value bit prepended to the information bit vector removes the ambiguity between codewords formed from information bit vectors differing by a first bit value in each of the information bit vectors that would otherwise result from an unknown phase of a physical channel over which the codewords are transmitted. This reduces the decoding BLER at the receiver when using Reed Muller codes for noncoherent communication, which may increase decoding performance at the receiver while permitting the use of Reed Muller codes for noncoherent communication, which decreases the demodulation and decoding complexity for the receiver.

As indicated above, FIGS. 5A-5C are provided as one or more examples. Other examples may differ from what is described with respect to FIGS. 5A-5C.

Figure 6:
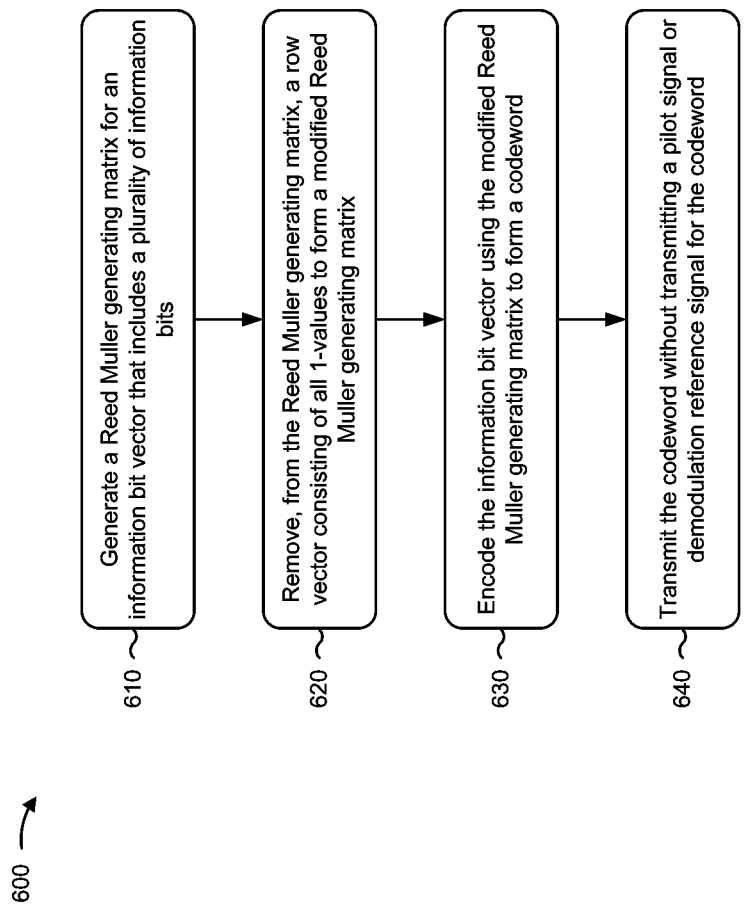
FIGS. 6 and 7 are diagrams illustrating example processes performed, for example, by a wireless communication device, in accordance with various aspects of the present disclosure.

FIG. 6 is a diagram illustrating an example process 600 performed, for example, by a wireless communication device, in accordance with various aspects of the present disclosure. Example process 600 is an example where the wireless communication device (e.g., UE 120, base station 110, and/or the like) performs operations associated with noncoherent wireless communication using modified Reed Muller codes.

As shown in FIG. 6, in some aspects, process 600 may include generating a Reed Muller generating matrix for an information bit vector that includes a plurality of information bits (block 610). For example, the wireless communication device (e.g., using transmit processor 220, receive processor 238, controller/processor 240, memory 242, receive processor 258, transmit processor 264, controller/processor 280, memory 282, and/or the like) may generate a Reed Muller generating matrix for an information bit vector that includes a plurality of information bits, as described above. In some aspects, generating the Reed Muller generating matrix comprises generating the Reed Muller generating matrix using an order that satisfies an order threshold, wherein the order threshold is 2 or 3.

As further shown in FIG. 6, in some aspects, process 600 may include removing, from the Reed Muller generating matrix, a row vector consisting of all 1-values to form a modified Reed Muller generating matrix (block 620). For example, the wireless communication device (e.g., using transmit processor 220, receive processor 238, controller/processor 240, memory 242, receive processor 258, transmit processor 264, controller/processor 280, memory 282, and/or the like) may remove, from the Reed Muller generating matrix, a row vector consisting of all 1-values to form a modified Reed Muller generating matrix, as described above. In some aspects, determining a largest value for the dimension m of the codeword comprises determining a largest value for a dimension m of the codeword such that $2^m$ is less than or equal to a block length n of the information bit vector; generating a $2^m$-length codeword; and cyclically repeating the $2^m$-length codeword to form an n-length codeword. In some aspects, encoding the information bit vector using the modified Reed Muller generating matrix to form the codeword comprises determining a largest value for the dimension m of the codeword based at least in part on an upper limit for an order of the codeword.

As further shown in FIG. 6, in some aspects, process 600 may include encoding the information bit vector using the modified Reed Muller generating matrix to form a codeword (block 630). For example, the wireless communication device (e.g., using transmit processor 220, receive processor 238, controller/processor 240, memory 242, receive processor 258, transmit processor 264, controller/processor 280, memory 282, and/or the like) may encode the information bit vector using the modified Reed Muller generating matrix to form a codeword, as described above.

As further shown in FIG. 6, in some aspects, process 600 may include transmitting the codeword without transmitting a pilot signal or demodulation reference signal for the codeword (block 640). For example, the wireless communication device (e.g., using transmit processor 220, receive processor 238, controller/processor 240, memory 242, receive processor 258, transmit processor 264, controller/processor 280, memory 282, and/or the like) may transmit the codeword without transmitting a pilot signal or demodulation reference signal for the codeword, as described above. In some aspects, transmitting the codeword without transmitting a pilot signal or demodulation reference signal for the codeword comprises determining that a coding rate to be used for the information bit vector satisfies a coding rate threshold and transmitting, based at least in part on determining that the coding rate satisfies the coding rate threshold, the codeword without transmitting a pilot signal or demodulation reference signal for the codeword. In some aspects, transmitting the codeword without transmitting a pilot signal or demodulation reference signal for the codeword comprises determining that a quantity of bits included in the information bit vector satisfies a quantity threshold and transmitting, based at least in part on determining that the quantity of bits satisfies the quantity threshold, the codeword without transmitting a pilot signal or demodulation reference signal for the codeword.

Process 600 may include additional aspects, such as any single aspect or any combination of aspects described below and/or in connection with one or more other processes described elsewhere herein.

In some aspects, process 600 includes modulating the codeword using $\pi/2$ BPSK modulation or quadrature phase-shift keying (QPSK) modulation.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
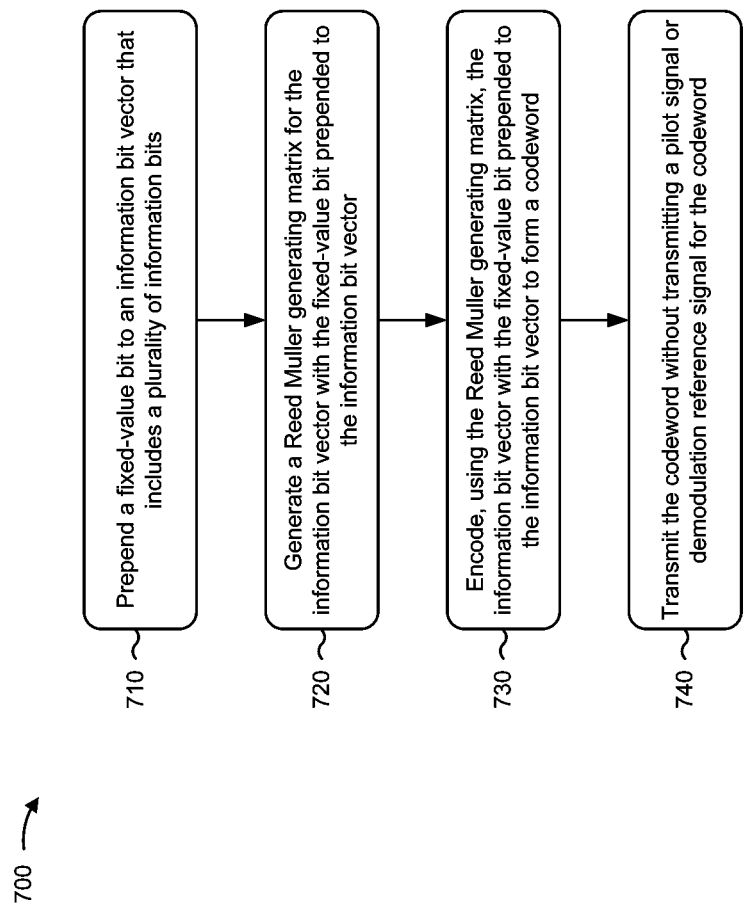

FIG. 7 is a diagram illustrating an example process 700 performed, for example, by a wireless communication device, in accordance with various aspects of the present disclosure. Example process 700 is an example where the wireless communication device (e.g., UE 120, base station 110, and/or the like) performs operations associated with noncoherent wireless communication using modified Reed Muller codes.

As shown in FIG. 7, in some aspects, process 700 may include prepending a fixed-value bit to an information bit vector that includes a plurality of information bits (block 710). For example, the wireless communication device (e.g., using transmit processor 220, receive processor 238, controller/processor 240, memory 242, receive processor 258, transmit processor 264, controller/processor 280, memory 282, and/or the like) may prepend a fixed-value bit to an information bit vector that includes a plurality of information bits, as described above. In some aspects, the fixed-value bit is a 0-value bit. In some aspects, the fixed-value bit is a 1-value bit.

As further shown in FIG. 7, in some aspects, process 700 may include generating a Reed Muller generating matrix for the information bit vector (block 720). For example, the wireless communication device (e.g., using transmit processor 220, receive processor 238, controller/processor 240, memory 242, receive processor 258, transmit processor 264, controller/processor 280, memory 282, and/or the like) may generate a Reed Muller generating matrix for the information bit vector, as described above. In some aspects, generating the Reed Muller generating matrix comprises generating the Reed Muller generating matrix using an order that satisfies an order threshold, wherein the order threshold is 2 or 3.

As further shown in FIG. 7, in some aspects, process 700 may include encoding, using the Reed Muller generating matrix, the information bit vector with the fixed-value bit prepended to the information bit vector to form a codeword (block 730). For example, the wireless communication device (e.g., using transmit processor 220, receive processor 238, controller/processor 240, memory 242, receive processor 258, transmit processor 264, controller/processor 280, memory 282, and/or the like) may encode, using the Reed Muller generating matrix, the information bit vector with the fixed-value bit prepended to the information bit vector to form a codeword, as described above. In some aspects, encoding the information bit vector using the Reed Muller generating matrix to form the codeword comprises determining a largest value for a dimension m of the codeword such that $2^m$ is less than or equal to a block length n of the information bit vector; generating a $2^m$-length codeword; and cyclically repeating the $2^m$-length codeword to form an n-length codeword. In some aspects, determining a largest value for the dimension m of the codeword comprises determining a largest value for the dimension m of the codeword based at least in part on an upper limit for an order of the codeword.

As further shown in FIG. 7, in some aspects, process 700 may include transmitting the codeword without transmitting a pilot signal or demodulation reference signal for the codeword (block 740). For example, the wireless communication device (e.g., using transmit processor 220, receive processor 238, controller/processor 240, memory 242, receive processor 258, transmit processor 264, controller/processor 280, memory 282, and/or the like) may transmit the codeword without transmitting a pilot signal or demodulation reference signal for the codeword, as described above. In some aspects, transmitting the codeword without transmitting a pilot signal or demodulation reference signal for the codeword comprises determining that a coding rate to be used for the information bit vector satisfies a coding rate threshold and transmitting, based at least in part on determining that the coding rate satisfies the coding rate threshold, the codeword without transmitting a pilot signal or demodulation reference signal for the codeword. In some aspects, transmitting the codeword without transmitting a pilot signal or demodulation reference signal for the codeword comprises determining that a quantity of bits included in the information bit vector satisfies a quantity threshold and transmitting, based at least in part on determining that the quantity of bits satisfies the quantity threshold, the codeword without transmitting a pilot signal or demodulation reference signal for the codeword.

Process 700 may include additional aspects, such as any single aspect or any combination of aspects described below and/or in connection with one or more other processes described elsewhere herein.

In some aspects, process 700 includes modulating the codeword using $\pi/2$ binary BPSK modulation or quadrature phase-shift keying (QPSK) modulation.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
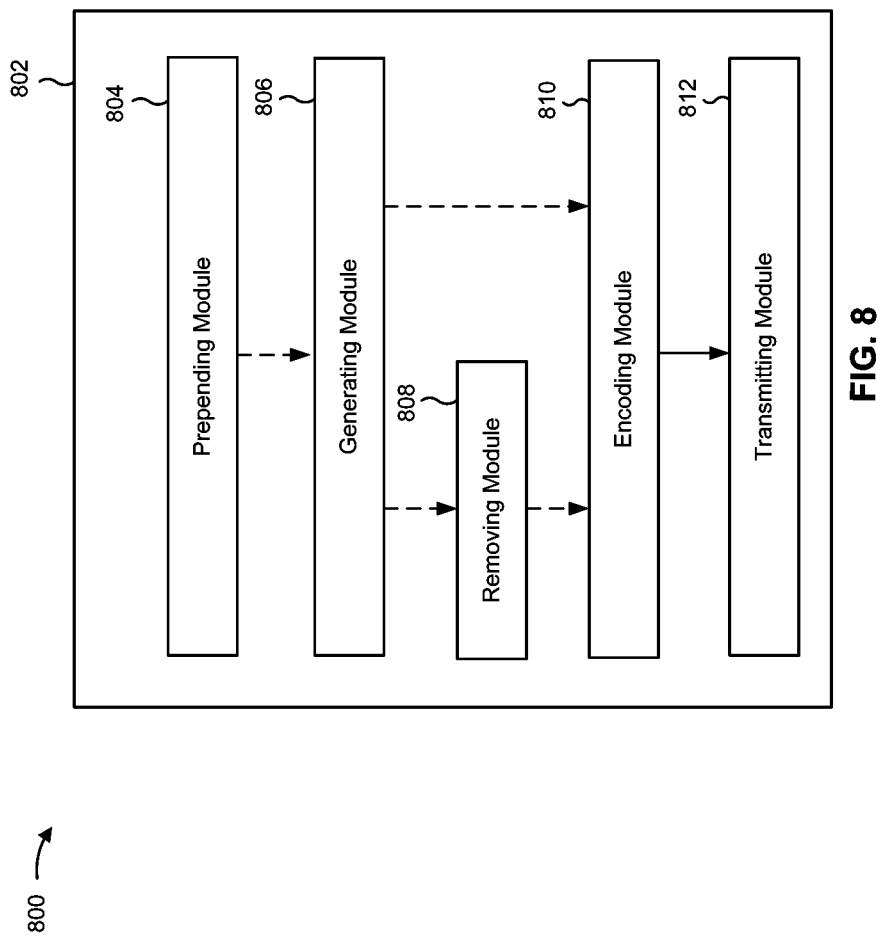
FIG. 8 is a conceptual data flow diagram illustrating the data flow between different modules/means/components in an example apparatus, in accordance with various aspects of the present disclosure.

FIG. 8 is a conceptual data flow diagram 800 illustrating data flow between different modules/means/components in an example apparatus 802. The apparatus 802 may be a UE (e.g., UE 120), a base station (e.g., base station 110), and/or the like. In some aspects, the apparatus 802 includes a prepending module 804, a generating module 806, a removing module 808, an encoding module 810, and a transmitting module 812.

In some aspects, prepending module 804 may prepend a fixed-value bit to an information bit vector that includes a plurality of information bits, generating module 806 may generate a Reed Muller generating matrix for the information bit vector with the fixed-value bit prepended to the information bit vector, encoding module 810 may encode, using the Reed Muller generating matrix, the information bit vector with the fixed-value bit prepended to the information bit vector to form a codeword, and transmitting module 812 may transmit the codeword without transmitting a pilot signal or demodulation reference signal for the codeword. In some aspects, generating module 806 may generate a Reed Muller generating matrix for an information bit vector that includes a plurality of information bits, removing module 808 may remove, from the Reed Muller generating matrix, a row vector consisting of all 1-values to form a modified Reed Muller generating matrix, encoding module 810 may encode the information bit vector using the modified Reed Muller generating matrix to form a codeword, and transmitting module 812 may transmit the codeword without transmitting a pilot signal or demodulation reference signal for the codeword.

In some aspects, prepending module 804, generating module 806, removing module 808, and encoding module 810 may each include a receive processor (e.g., receive processor 238, receive processor 258, and/or the like), a transmit processor (e.g., transmit processor 220, transmit processor 264, and/or the like), a controller/processor (e.g., controller/processor 240, controller/processor 280, and/or the like), a memory (e.g., memory 242, memory 282, and/or the like), and/or the like. In some aspects, transmitting module 812 may include an antenna (e.g., antenna 234, antenna 252, and/or the like), a MOD (e.g., MOD 232, MOD 254, and/or the like), a transmit processor (e.g., transmit processor 220, transmit processor 264, and/or the like), a Tx MIMO processor (e.g., Tx MIMO processor 230, Tx MIMO processor 266, and/or the like), a controller/processor (e.g., controller/processor 240, controller/processor 280, and/or the like), a memory (e.g., memory 242, memory 282, and/or the like), and/or the like.

The apparatus may include additional modules that perform each of the blocks of the algorithm in the aforementioned process 600 of FIG. 6, process 700 of FIG. 7, and/or the like. Each block in the aforementioned process 600 of FIG. 6, process 700 of FIG. 7, and/or the like may be performed by a module, and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

The number and arrangement of modules shown in FIG. 8 are provided as an example. In practice, there may be additional modules, fewer modules, different modules, or differently arranged modules than those shown in FIG. 8. Furthermore, two or more modules shown in FIG. 8 may be implemented within a single module, or a single module shown in FIG. 8 may be implemented as multiple, distributed modules. Additionally, or alternatively, a set of modules (e.g., one or more modules) shown in FIG. 8 may perform one or more functions described as being performed by another set of modules shown in FIG. 8.

Figure 9:
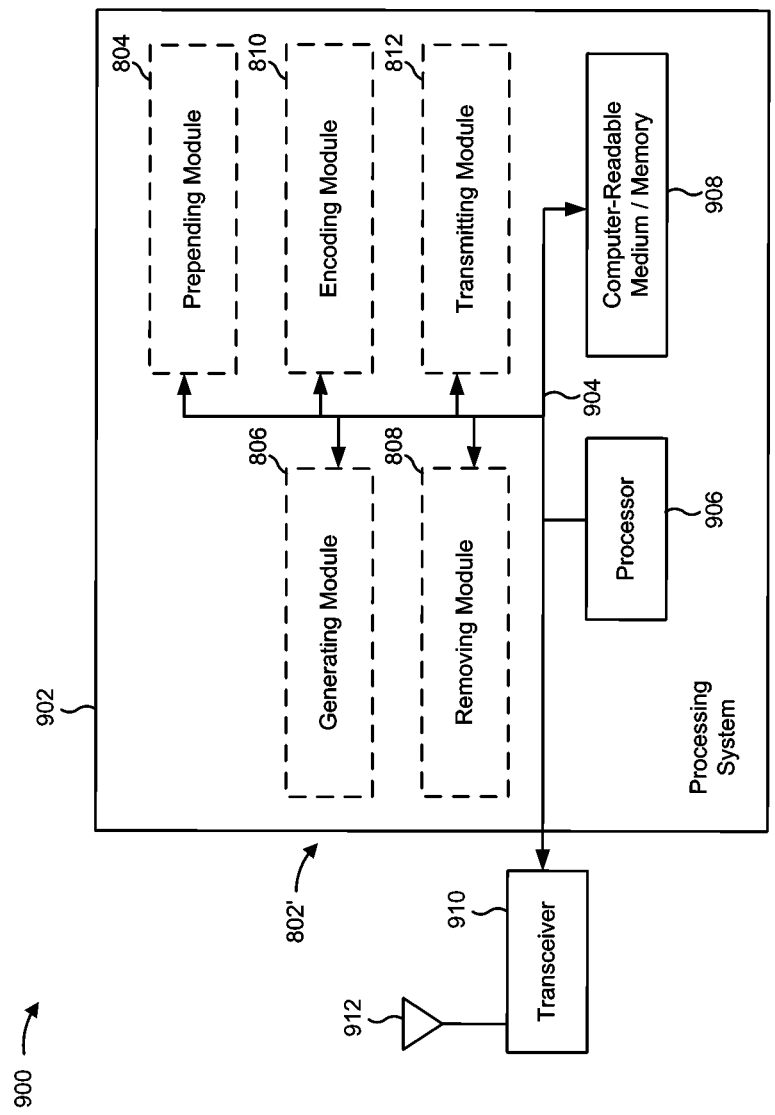
FIG. 9 is a diagram illustrating an example of a hardware implementation for an apparatus employing a processing system, in accordance with various aspects of the present disclosure.

FIG. 9 is a diagram 900 illustrating an example of a hardware implementation for an apparatus 802' employing a processing system 902. The apparatus 802' may be a UE (e.g., UE 120), a base station (e.g., base station 110), and/or the like.

The processing system 902 may be implemented with a bus architecture, represented generally by the bus 904. The bus 904 may include any number of interconnecting buses and bridges depending on the specific application of the processing system 902 and the overall design constraints. The bus 904 links together various circuits including one or more processors and/or hardware modules, represented by the processor 906, the modules 804, 806, 808, 810, and 812, and the computer-readable medium/memory 908. The bus 904 may also link various other circuits such as timing sources, peripherals, voltage regulators, and power management circuits, which are well known in the art, and therefore will not be described any further.

The processing system 902 may be coupled to a transceiver 910. The transceiver 910 is coupled to one or more antennas 912. The transceiver 910 provides a means for communicating with various other apparatuses over a transmission medium. The transceiver 910 receives a signal from the one or more antennas 912, extracts information from the received signal, and provides the extracted information to the processing system 902. In addition, the transceiver 910 receives information from the processing system 902, specifically the transmitting module 808, and based at least in part on the received information, generates a signal to be applied to the one or more antennas 912. The processing system 902 includes a processor 906 coupled to a computer-readable medium/memory 908. The processor 906 is responsible for general processing, including the execution of software stored on the computer-readable medium/memory 908. The software, when executed by the processor 906, causes the processing system 902 to perform the various functions described herein for any particular apparatus. The computer-readable medium/memory 908 may also be used for storing data that is manipulated by the processor 906 when executing software. The processing system further includes at least one of the modules 804, 806, 808, 810, and 812. The modules may be software modules running in the processor 906, resident/stored in the computer readable medium/memory 908, one or more hardware modules coupled to the processor 906, or some combination thereof. In some aspects, the processing system 902 may be a component of the UE 120 and may include the memory 282 and/or at least one of the transmit processor 264, the receive processor 258, and/or the controller/processor 280. In some aspects, the processing system 902 may be a component of the base station 110 and may include the memory 242 and/or at least one of the transmit processor 220, the receive processor 238, and/or the controller/processor 240.

In some aspects, the apparatus 802/802' for wireless communication includes means for generating a Reed Muller generating matrix for an information bit vector that includes a plurality of information bits, means for removing, from the Reed Muller generating matrix, a row vector consisting of all 1-values to form a modified Reed Muller generating matrix, means for encoding the information bit vector using the modified Reed Muller generating matrix to form a codeword, means for transmitting the codeword without transmitting a pilot signal or demodulation reference signal for the codeword, and/or the like In some aspects, the apparatus 802/802' for wireless communication includes means for prepending a fixed-value bit to an information bit vector that includes a plurality of information bits, means for generating a Reed Muller generating matrix for the information bit vector with the fixed-value bit prepended to the information bit vector, means for encoding, using the Reed Muller generating matrix, the information bit vector with the fixed-value bit prepended to the information bit vector to form a codeword, means for transmitting the codeword without transmitting a pilot signal or demodulation reference signal for the codeword, and/or the like.

The aforementioned means may be one or more of the aforementioned modules of the apparatus 802 and/or the processing system 902 of the apparatus 802' configured to perform the functions recited by the aforementioned means. As described elsewhere herein, the processing system 902 may include the transmit processor 264, the receive processor 258, and/or the controller/processor 280. In one configuration, the aforementioned means may be the transmit processor 264, the receive processor 258, and/or the controller/processor 280 configured to perform the functions and/or operations recited herein. As described elsewhere herein, the processing system 902 may include the transmit processor 220, the receive processor 238, and/or the controller/processor 240. In one configuration, the aforementioned means may be the transmit processor 220, the receive processor 238, and/or the controller/processor 240 configured to perform the functions and/or operations recited herein.

FIG. 9 is provided as an example. Other examples may differ from what is described in connection with FIG. 9.

The following provides an overview of aspects of the present disclosure:

Aspect 1: A method of wireless communication performed by a wireless communication device, comprising: generating a Reed Muller generating matrix for an information bit vector that includes a plurality of information bits; removing, from the Reed Muller generating matrix, a row vector consisting of all 1-values to form a modified Reed Muller generating matrix; encoding the information bit vector using the modified Reed Muller generating matrix to form a codeword; and transmitting the codeword without transmitting a pilot signal or demodulation reference signal for the codeword.

Aspect 2: The method of aspect 1, wherein transmitting the codeword without transmitting a pilot signal or demodulation reference signal for the codeword comprises: determining that a coding rate to be used for the information bit vector satisfies a coding rate threshold; and transmitting, based at least in part on determining that the coding rate satisfies the coding rate threshold, the codeword without transmitting a pilot signal or demodulation reference signal for the codeword.

Aspect 3: The method of aspect 1, wherein transmitting the codeword without transmitting a pilot signal or demodulation reference signal for the codeword comprises: determining that a quantity of bits included in the information bit vector satisfies a quantity threshold; and transmitting, based at least in part on determining that the quantity of bits satisfies the quantity threshold, the codeword without transmitting a pilot signal or demodulation reference signal for the codeword. Aspect 4: The method of aspect 1, wherein encoding the information bit vector using the modified Reed Muller generating matrix to form the codeword comprises: determining a largest value for a dimension m of the codeword such that 2 m is less than or equal to a block length n of the information bit vector; generating a 2 m -length codeword; and cyclically repeating the 2 m-length codeword to form an n-length codeword.

Aspect 5: The method of aspect 4, wherein determining a largest value for the dimension m of the codeword comprises: determining a largest value for the dimension m of the codeword based at least in part on an upper limit for an order of the codeword. Aspect 6: The method of aspect 1, further comprising: modulating the codeword using binary phase shift keying (BPSK) modulation or quadrature phase-shift keying (QPSK) modulation. Aspect 7: The method of aspect 1, wherein generating the Reed Muller generating matrix comprises: generating the Reed Muller generating matrix using an order that satisfies an order threshold.

Aspect 8: A method of wireless communication performed by a wireless communication device, comprising: prepending a fixed-value bit to an information bit vector that includes a plurality of information bits; generating a Reed Muller generating matrix for the information bit vector; encoding, using the Reed Muller generating matrix, the information bit vector with the fixed-value bit prepended to the information bit vector to form a codeword; and transmitting the codeword without transmitting a pilot signal or demodulation reference signal for the codeword.

Aspect 9: The method of aspect 8, wherein transmitting the codeword without transmitting a pilot signal or demodulation reference signal for the codeword comprises: determining that a coding rate to be used for the information bit vector satisfies a coding rate threshold; and transmitting, based at least in part on determining that the coding rate satisfies the coding rate threshold, the codeword without transmitting a pilot signal or demodulation reference signal for the codeword. Aspect 10: The method of aspect 8, wherein transmitting the codeword without transmitting a pilot signal or demodulation reference signal for the codeword comprises: determining that a quantity of bits included in the information bit vector satisfies a quantity threshold; and transmitting, based at least in part on determining that the quantity of bits satisfies the quantity threshold, the codeword without transmitting a pilot signal or demodulation reference signal for the codeword.

Aspect 11: The method of aspect 8, wherein encoding the information bit vector using the Reed Muller generating matrix to form the codeword comprises: determining a largest value for a dimension m of the codeword such that 2 m is less than or equal to a block length n of the information bit vector; generating a 2 m-length codeword; and cyclically repeating the 2 m-length codeword to form an n-length codeword. Aspect 12: The method of aspect 11, wherein determining a largest value for the dimension m of the codeword comprises: determining a largest value for the dimension m of the codeword based at least in part on an upper limit for an order of the codeword. Aspect 13: The method of aspect 8, further comprising: modulating the codeword using binary phase shift keying (BPSK) modulation or quadrature phase-shift keying (QPSK) modulation.

Aspect 14: The method of aspect 8, wherein generating the Reed Muller generating matrix comprises: generating the Reed Muller generating matrix using an order that satisfies an order threshold. Aspect 15: The method of aspect 8, wherein the fixed-value bit is a 0-value bit. Aspect 16: The method of aspect 8, wherein the fixed-value bit is a 1-value bit.

Aspect 17: An apparatus for wireless communication at a device, comprising a processor; memory coupled with the processor; and instructions stored in the memory and executable by the processor to cause the apparatus to perform the method of one or more aspects of aspects 1-7. Aspect 18: A device for wireless communication, comprising a memory and one or more processors coupled to the memory, the memory and the one or more processors configured to perform the method of one or more aspects of aspects 1-7. Aspect 19: An apparatus for wireless communication, comprising at least one means for performing the method of one or more aspects of aspects 1-7.

Aspect 20: A non-transitory computer-readable medium storing code for wireless communication, the code comprising instructions executable by a processor to perform the method of one or more aspects of aspects 1-7. Aspect 21: A non-transitory computer-readable medium storing a set of instructions for wireless communication, the set of instructions comprising one or more instructions that, when executed by one or more processors of a device, cause the device to perform the method of one or more aspects of aspects 1-7.

Aspect 22: An apparatus for wireless communication at a device, comprising a processor; memory coupled with the processor; and instructions stored in the memory and executable by the processor to cause the apparatus to perform the method of one or more aspects of aspects 8-16. Aspect 23: A device for wireless communication, comprising a memory and one or more processors coupled to the memory, the memory and the one or more processors configured to perform the method of one or more aspects of aspects 8-16. Aspect 24: An apparatus for wireless communication, comprising at least one means for performing the method of one or more aspects of aspects 8-16.

Aspect 25: A non-transitory computer-readable medium storing code for wireless communication, the code comprising instructions executable by a processor to perform the method of one or more aspects of aspects 8-16. Aspect 26: A non-transitory computer-readable medium storing a set of instructions for wireless communication, the set of instructions comprising one or more instructions that, when executed by one or more processors of a device, cause the device to perform the method of one or more aspects of aspects 8-16.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a wireless communication device, comprising:
   generating a Reed Muller generating matrix for an information bit vector that includes a plurality of information bits;
   removing, from the Reed Muller generating matrix, a row vector consisting of all 1-values to form a modified Reed Muller generating matrix;
   encoding the information bit vector using the modified Reed Muller generating matrix to form a codeword; and
   transmitting the codeword without transmitting a pilot signal or demodulation reference signal for the codeword.

2. The method of claim 1, wherein transmitting the codeword without transmitting a pilot signal or demodulation reference signal for the codeword comprises:
   determining that a coding rate to be used for the information bit vector satisfies a coding rate threshold; and
   transmitting, based at least in part on determining that the coding rate satisfies the coding rate threshold, the codeword without transmitting a pilot signal or demodulation reference signal for the codeword.

3. The method of claim 1, wherein transmitting the codeword without transmitting a pilot signal or demodulation reference signal for the codeword comprises:
   determining that a quantity of bits included in the information bit vector satisfies a quantity threshold; and
   transmitting, based at least in part on determining that the quantity of bits satisfies the quantity threshold, the codeword without transmitting a pilot signal or demodulation reference signal for the codeword.

4. The method of claim 1, wherein encoding the information bit vector using the modified Reed Muller generating matrix to form the codeword comprises:
   determining a largest value for a dimension m of the codeword such that $2^m$ is less than or equal to a block length n of the information bit vector;
   generating a $2^m$-length codeword; and
   cyclically repeating the $2^m$-length codeword to form an n-length codeword.

5. The method of claim 4, wherein determining a largest value for the dimension m of the codeword comprises:
   determining a largest value for the dimension m of the codeword based at least in part on an upper limit for an order of the codeword.

6. The method of claim 1, further comprising:
   modulating the codeword using $\pi/2$ binary phase shift keying (BPSK) modulation or quadrature phase-shift keying (QPSK) modulation.

7. The method of claim 1, wherein generating the Reed Muller generating matrix comprises:
   generating the Reed Muller generating matrix using an order that satisfies an order threshold.

8. A method of wireless communication performed by a wireless communication device, comprising:
   prepending a fixed-value bit to an information bit vector that includes a plurality of information bits;
   generating a Reed Muller generating matrix for the information bit vector;
   encoding, using the Reed Muller generating matrix, the information bit vector with the fixed-value bit prepended to the information bit vector to form a codeword; and
   transmitting the codeword without transmitting a pilot signal or demodulation reference signal for the codeword.

9. The method of claim 8, wherein transmitting the codeword without transmitting a pilot signal or demodulation reference signal for the codeword comprises:
   determining that a coding rate to be used for the information bit vector satisfies a coding rate threshold; and
   transmitting, based at least in part on determining that the coding rate satisfies the coding rate threshold, the codeword without transmitting a pilot signal or demodulation reference signal for the codeword.

10. The method of claim 8, wherein transmitting the codeword without transmitting a pilot signal or demodulation reference signal for the codeword comprises:
    determining that a quantity of bits included in the information bit vector satisfies a quantity threshold; and
    transmitting, based at least in part on determining that the quantity of bits satisfies the quantity threshold, the codeword without transmitting a pilot signal or demodulation reference signal for the codeword.

11. The method of claim 8, wherein encoding the information bit vector using the Reed Muller generating matrix to form the codeword comprises:
    determining a largest value for a dimension m of the codeword such that $2^m$ is less than or equal to a block length n of the information bit vector;
    generating a $2^m$-length codeword; and
    cyclically repeating the $2^m$-length codeword to form an n-length codeword.

12. The method of claim 11, wherein determining a largest value for the dimension m of the codeword comprises:
    determining a largest value for the dimension m of the codeword based at least in part on an upper limit for an order of the codeword.

13. The method of claim 8, further comprising:
    modulating the codeword using $\pi/2$ binary phase shift keying (BPSK) modulation or quadrature phase-shift keying (QPSK) modulation.

14. The method of claim 8, wherein generating the Reed Muller generating matrix comprises:
    generating the Reed Muller generating matrix using an order that satisfies an order threshold.

15. The method of claim 8, wherein the fixed-value bit is a 0-value bit.

16. The method of claim 8, wherein the fixed-value bit is a 1-value bit.

17. A wireless communication device for wireless communication, comprising:
a memory; and
one or more processors operatively coupled to the memory, the memory and the one or more processors configured to:
generate a Reed Muller generating matrix for an information bit vector that includes a plurality of information bits;
remove, from the Reed Muller generating matrix, a row vector consisting of all 1-values to form a modified Reed Muller generating matrix;
encode the information bit vector using the modified Reed Muller generating matrix to form a codeword; and
transmit the codeword without transmitting a pilot signal or demodulation reference signal for the codeword.

18. The wireless communication device of claim 17, wherein the one or more processors, when transmitting the codeword without transmitting a pilot signal or demodulation reference signal for the codeword, are to:
determine that a coding rate to be used for the information bit vector satisfies a coding rate threshold; and
transmit, based at least in part on determining that the coding rate satisfies the coding rate threshold, the codeword without transmitting a pilot signal or demodulation reference signal for the codeword.

19. The wireless communication device of claim 17, wherein the one or more processors, when transmitting the codeword without transmitting a pilot signal or demodulation reference signal for the codeword, are to:
determine that a quantity of bits included in the information bit vector satisfies a quantity threshold; and
transmit, based at least in part on determining that the quantity of bits satisfies the quantity threshold, the codeword without transmitting a pilot signal or demodulation reference signal for the codeword.

20. The wireless communication device of claim 17, wherein the one or more processors, when encoding the information bit vector using the modified Reed Muller generating matrix to form the codeword, are to:
determine a largest value for a dimension m of the codeword such that $2^m$ is less than or equal to a block length n of the information bit vector;
generate a $2^m$-length codeword; and
cyclically repeat the $2^m$-length codeword to form an n-length codeword.

21. The wireless communication device of claim 20, wherein the one or more processors, when determining a largest value for the dimension m of the codeword are to:
determine a largest value for the dimension m of the codeword based at least in part on an upper limit for an order of the codeword.

22. The wireless communication device of claim 17, wherein the one or more processors are further configured to:
modulate the codeword using $\pi/2$ binary phase shift keying (BPSK) modulation or quadrature phase-shift keying (QPSK) modulation.

23. The wireless communication device of claim 17 wherein the one or more processors, when generating the Reed Muller generating matrix comprises:
generate the Reed Muller generating matrix using an order that satisfies an order threshold.

24. A wireless communication device for wireless communication, comprising:
a memory; and
one or more processors operatively coupled to the memory, the memory and the one or more processors configured to:
prepend a fixed-value bit to an information bit vector that includes a plurality of information bits;
generate a Reed Muller generating matrix for the information bit vector;
encode, using the Reed Muller generating matrix, the information bit vector with the fixed-value bit prepended to the information bit vector to form a codeword; and
transmit the codeword without transmitting a pilot signal or demodulation reference signal for the codeword.

25. The wireless communication device of claim 24, wherein the one or more processors, when transmitting the codeword without transmitting a pilot signal or demodulation reference signal for the codeword, are to:
determine that a coding rate to be used for the information bit vector satisfies a coding rate threshold; and
transmit, based at least in part on determining that the coding rate satisfies the coding rate threshold, the codeword without transmitting a pilot signal or demodulation reference signal for the codeword.

26. The wireless communication device of claim 24, wherein the one or more processors, when transmitting the codeword without transmitting a pilot signal or demodulation reference signal for the codeword, are to:
determine that a quantity of bits included in the information bit vector satisfies a quantity threshold; and
transmit, based at least in part on determining that the quantity of bits satisfies the quantity threshold, the codeword without transmitting a pilot signal or demodulation reference signal for the codeword.

27. The wireless communication device of claim 24, wherein the one or more processors, when encoding the information bit vector using the Reed Muller generating matrix to form the codeword, are to:
determine a largest value for a dimension m of the codeword such that $2^m$ is less than or equal to a block length n of the information bit vector;
generate a $2^m$-length codeword; and
cyclically repeat the $2^m$-length codeword to form an n-length codeword.

28. The wireless communication device of claim 27, wherein the one or more processors, when determining a largest value for the dimension m of the codeword, are to:
determine a largest value for the dimension m of the codeword based at least in part on an upper limit for an order of the codeword.

29. The wireless communication device of claim 24, wherein the one or more processors are further configured to:
modulate the codeword using $\pi/2$ binary phase shift keying (BPSK) modulation or quadrature phase-shift keying (QPSK) modulation.

30. The wireless communication device of claim 24, wherein the one or more processors, when generating the Reed Muller generating matrix, are to:
generate the Reed Muller generating matrix using an order that satisfies an order threshold.

\* \* \* \* \*